United States Patent
Wang et al.

(10) Patent No.: US 10,446,622 B2
(45) Date of Patent: Oct. 15, 2019

(54) OLED PIXEL DEFINING STRUCTURE WITH AT LEAST TWO INTERCOMMUNICATED SUB-PIXEL DEFINING ZONES OF SAME COLOR, MANUFACTURING METHOD THEREOF AND ARRAY SUBSTRATE

(71) Applicant: BOE TECHNOLOGY GROUP CO., LTD., Beijing (CN)

(72) Inventors: Huifeng Wang, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 431 days.

(21) Appl. No.: 14/345,540

(22) PCT Filed: Nov. 19, 2013

(86) PCT No.: PCT/CN2013/087386
§ 371 (c)(1),
(2) Date: Mar. 18, 2014

(87) PCT Pub. No.: WO2014/190685
PCT Pub. Date: Dec. 4, 2014

(65) Prior Publication Data
US 2016/0043150 A1    Feb. 11, 2016

(30) Foreign Application Priority Data
May 29, 2013    (CN) .......................... 2013 1 0205843

(51) Int. Cl.
*H01L 27/32*    (2006.01)
*H01L 27/12*    (2006.01)
(Continued)

(52) U.S. Cl.
CPC ...... *H01L 27/3246* (2013.01); *H01L 21/0274* (2013.01); *H01L 27/127* (2013.01);
(Continued)

(58) Field of Classification Search
CPC ............. H01L 27/3216; H01L 27/3218; H01L 27/3246; H01L 27/3211–3218;
(Continued)

(56) References Cited

U.S. PATENT DOCUMENTS

2009/0284135 A1   11/2009  Yoshida et al.
2010/0156279 A1*  6/2010   Tamura ............... H01L 27/3211
                                                              313/504
(Continued)

FOREIGN PATENT DOCUMENTS

CN    101158776 A    4/2008
CN    101543135 A    9/2009
(Continued)

OTHER PUBLICATIONS

Second Office Action issued by the Chinese Patent Office for Chinese Patent Application No. 2013102058430 dated Nov. 4, 2014, 5pgs.
(Continued)

*Primary Examiner* — Kevin Parendo

(57) ABSTRACT

There are provided an OLED pixel defining structure, a manufacturing method thereof and an array substrate. The OLED pixel defining structure includes a pixel defining layer, with a plurality of openings corresponding to sub-pixels of different colors being included in the pixel defining layer, each of the openings forming a sub-pixel defining zone of a corresponding color, wherein at least two sub-pixel defining zones of the same color are intercommunicated.

16 Claims, 3 Drawing Sheets

(51) Int. Cl.
*H01L 21/027* (2006.01)
*H01L 51/56* (2006.01)

(52) U.S. Cl.
CPC ...... *H01L 27/1292* (2013.01); *H01L 27/3202* (2013.01); *H01L 27/3204* (2013.01); *H01L 27/3216* (2013.01); *H01L 27/3218* (2013.01); *H01L 51/56* (2013.01); *H01L 2227/323* (2013.01)

(58) Field of Classification Search
CPC ............. H01L 27/3202; H01L 27/3204; H01L 27/127; H01L 27/1292; H01L 21/0274
See application file for complete search history.

(56) References Cited

U.S. PATENT DOCUMENTS

| | | | |
|---|---|---|---|
| 2011/0052819 A1* | 3/2011 | Ebisawa | B05C 5/0208 427/372.2 |
| 2012/0091888 A1 | 4/2012 | Yoshida et al. | |
| 2013/0001620 A1* | 1/2013 | Sugisawa | H01L 27/3246 257/98 |
| 2013/0278144 A1* | 10/2013 | Levermore | H01L 51/5203 315/121 |
| 2013/0320308 A1* | 12/2013 | Lee | H01L 51/52 257/40 |
| 2014/0097413 A1 | 4/2014 | Chen | |

FOREIGN PATENT DOCUMENTS

| | | |
|---|---|---|
| CN | 102709243 A | 10/2012 |
| CN | 103311269 A | 9/2013 |
| JP | 2007-115529 A | 5/2007 |

OTHER PUBLICATIONS

English translation of Second Office Action issued by the Chinese Patent Office for Chinese Patent Application No. 2013102058430 dated Nov. 4, 2014, 5pgs.
Third Office Action issued by the Chinese Patent Office for Chinese Patent Application No. 2013102058430 dated Mar. 9, 2015, 5pgs.
English translation of Third Office Action issued by the Chinese Patent Office for Chinese Patent Application No. 2013102058430 dated Mar. 9, 2015, 5pgs.
International Preliminary Report on Patentability dated Dec. 1, 2015, PCT/CN2013/087386.
First Office Action issued by the Chinese Patent Office for Chinese Patent Application No. 2013102058430 dated May 19, 2014, 7pgs.
English translation of First Office Action issued by the Chinese Patent Office for Chinese Patent Application No. 2013102058430 dated May 19, 2014, 5pgs.
International Search Report for International Application No. PCT/CN2013/087386, 14pgs.
Fourth Chinese Office Action dated May 5, 2016; Appln. No. 201310205843.0.
Fifth Chinese Office Action dated Nov. 22, 2016; Appln. No. 201310205843.0.

* cited by examiner

OLED PIXEL DEFINING STRUCTURE WITH AT LEAST TWO INTERCOMMUNICATED SUB-PIXEL DEFINING ZONES OF SAME COLOR, MANUFACTURING METHOD THEREOF AND ARRAY SUBSTRATE

CROSS REFERENCE TO RELATED APPLICATIONS

This application is based on International Application No. PCT/CN2013/087386 filed on Nov. 19, 2013, which claims priority to Chinese National Application No. 201310205843.0 filed on May 29, 2013. The entire contents of each and every foregoing application are incorporated herein by reference.

FIELD OF THE INVENTION

Embodiments of the present invention relate to an OLED pixel defining structure, a manufacturing method thereof and an array substrate.

BACKGROUND

An Organic Light Emitting Diode (OLED) has such unique features that it is self-emissive, fast response, and wide viewing angle, can be made on a flexible substrate, and so on, and display based on OLEDs is becoming the mainstream in the field of display.

An OLED display back panel comprises a TFT substrate, an ITO (Indium Tin Oxide) pixel electrode, a light emitting layer, a cathode, etc. A pixel defining layer is produced on the TFT substrate, and each pixel defining zone of it corresponds to one pixel electrode. The finer and denser each pixel defining zone and a pixel electrode corresponding to each pixel defining zone are, the higher the resolution of products is, but the finely divided pixel defining zone has been limited by printing technology. With the size of a pixel defining zone being 30 μm×90 μm as an example, when diameter of droplets formed by an inkjet head of a printer is equal to 30 μm, it is at the same level as size of a pixel. When an OLED device is fabricated with the ink-jet printer, it is necessary to take control of droplets, so that they precisely fall onto a pixel defining zone, and thickness of a thin film is uniform after the droplets falling into the pixel defining zone have been dried.

In prior art, control of precisely falling onto the pixel defining zone of droplets needs a printing equipment with a high alignment accuracy, and this requires increasing of the investment of equipment, leading to a higher cost. Furthermore, it is hard to form a thin film with a uniform thickness due to the fact that size of the pixel defining zone is smaller and flowability of the liquid is poor, and thus the quality of emission of the display back panel is affected.

SUMMARY

According to embodiments of the present invention, there is provided an OLED pixel defining structure comprising a pixel defining layer, the pixel defining layer containing a plurality of openings corresponding to sub-pixels of different colors therein, each of the openings forming a sub-pixel defining zone of a corresponding color, wherein at least two sub-pixel defining zones of a same color are intercommunicated.

According to an embodiment of the invention, there is provided a manufacturing method of an OLED pixel defining structure, comprising:

applying a layer of photoresist on a pixel electrode, so as to form a photoresist thin film for pixel definition;

conducting a patterning treatment on the photoresist thin film for pixel definition, so as to form a pixel defining layer; wherein at least two sub-pixel defining zones of a same color in the pixel defining layer are intercommunicated.

The OLED pixel defining structure in embodiments of the invention comprises the pixel defining layer; and the pixel defining layer comprises sub-pixel defining zones of different colors, wherein at least two sub-pixel defining zones of the same color are intercommunicated. As at least two sub-pixel defining zones of the same color in the pixel defining layer are intercommunicated, and droplets fall into the intercommunicated sub-pixel defining zones, the intercommunicated sub-pixel defining zones are full of liquid with the aid of the flowability of liquid; and furthermore, as the flowability of liquid is increased in view of intercommunication of at least two sub-pixel defining zones, it is easier to form a thin film with a uniform thickness within the sub-pixel defining zones. Thus, the quality of emission of the display back panel is improved.

BRIEF DESCRIPTION OF DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

The OLED pixel defining structure in embodiments of the invention comprises a pixel defining layer; and the pixel defining layer comprises sub-pixel defining zones of different colors, wherein at least two sub-pixel defining zones of the same color are intercommunicated. As at least two sub-pixel defining zones of the same color in the pixel defining layer are intercommunicated, and droplets fall into the intercommunicated sub-pixel defining zones, the intercommunicated sub-pixel defining zones are full of liquid with the aid of the flowability of liquid. Furthermore, as the flowability of liquid is increased in view of intercommunication of at least two sub-pixel defining zones, it is easier to form a thin film with a uniform thickness within the sub-pixel defining zones. Thus, the quality of emission of the display back panel is improved.

Hereinafter, embodiments of the invention will be further described in detail in combination with accompanied drawings of the specification.

Figure 1:
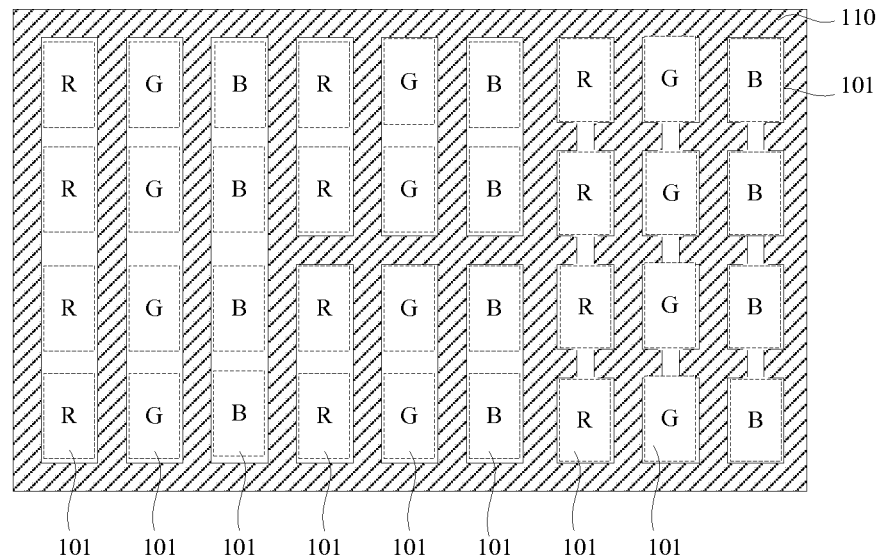
FIG. 1 is a schematic view illustrating an OLED pixel defining structure in an embodiment of the invention.

As illustrated in FIG. 1, which is a schematic view illustrating an OLED pixel defining structure in an embodiment of the invention, the pixel defining structure comprises a pixel defining layer 110 that comprises sub-pixel defining zones 101 of different colors. The pixel defining structure in FIG. 1 is illustrated as an example, in which sub-pixel defining zones in each column of the pixel defining structure are sub-pixel defining zones of the same color, and sub-pixel defining zones comprises red sub-pixel defining zones R, green sub-pixel defining zones G and blue sub-pixel defining zones B, and the other circumstance is in an analogous fashion to it. At least two sub-pixel defining zones 101 of the same color are intercommunicated, and in the figure, that illustrated by dotted lines is one sub-pixel defining zone, and that illustrated by solid lines are the intercommunicated sub-pixel defining zones.

Intercommunication of at least two sub-pixel defining zones 101 of the same color comprises two cases, and they will be introduced below, respectively.

Case 1, one sub-pixel defining zone 101 is intercommunicated with a sub-pixel defining zone 101 of the same color as it through a channel, and width of the channel between sub-pixel defining zones is smaller than width of the sub-pixel defining zones.

Figure 2:
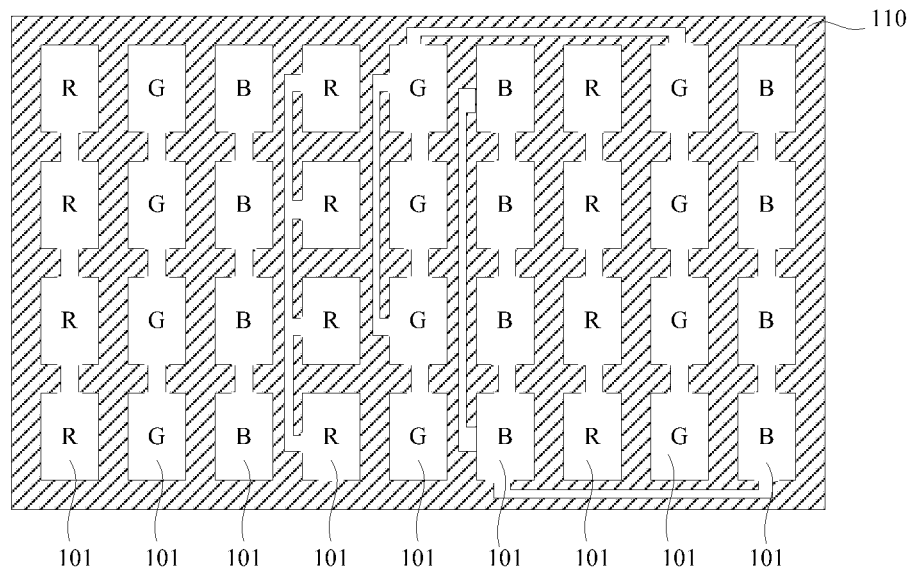
FIG. 2 is a schematic view illustrating intercommunication of one sub-pixel defining zone with sub-pixel defining zones of the same color through channels.

As illustrated in FIG. 2, with sub-pixel defining zones in the same column being sub-pixel defining zones of the same color as an example, "R" in the figure represents a red sub-pixel defining zone, "G" represents a green sub-pixel defining zone, and "B" represents a blue sub-pixel defining zone. One sub-pixel defining zone 101 is intercommunicated with adjacent sub-pixel defining zones 101 of the same color as it through channels, and each sub-pixel defining zone 101 is intercommunicated at most with two adjacent sub-pixel defining zones 101 of the same color as it. Alternatively, sub-pixel defining zones 101 of the same color intercommunicate with each other through channels, that is, one sub-pixel defining zone 101 is intercommunicated at least with two sub-pixel defining zones 101 of the same color as it; and sub-pixel defining zones 101 of the same color in different columns may also intercommunicate through a channel. The communication mode of sub-pixel defining zones arranged in other manner through a channel that is smaller than a sub-pixel defining zone in width is similar to the communication mode of sub-pixel defining zones in the same column, and details are omitted here.

Case 2, a channel between two adjacent sub-pixel defining zones 101 of the same color that are intercommunicated with each other has a width equal to that of the sub-pixel defining zones.

Figure 3:
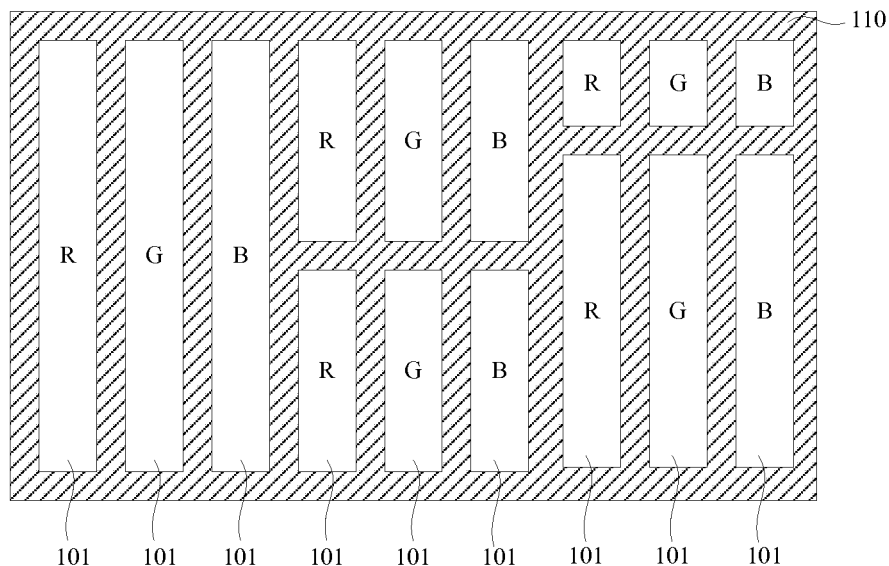
FIG. 3 schematically illustrates that no pixel defining layer exists between two sub-pixel defining zones of the same color that are intercommunicated in an embodiment of the invention.

As illustrated in FIG. 3, with sub-pixel defining zones in the same column being sub-pixel defining zones of the same color as an example, a pixel defining layer between two sub-pixel defining zones 101 of the same color in the same column that are adjacent is removed, to form one sub-pixel defining zone set; or a pixel defining layer between adjacent sub-pixel defining zones 101 of the same color in the same column is removed, to form two or more sub-pixel defining zone sets. Sub-pixel defining zone sets of the same color in different columns may be intercommunicated through a channel. The communication mode of sub-pixel defining zones arranged in other manner through a channel having the same width as a sub-pixel defining zone is similar to the communication mode of sub-pixel defining zones in the same column, and details are omitted here.

In an example, sub-pixel defining zones are a plurality of openings formed within the pixel defining layer. Each of the openings corresponds to one sub-pixel defining zone. The plurality of openings may be formed on a substrate in the form of a two-dimensional array. Regarding a channel through which different sub-pixel defining zones of the same color are intercommunicated, it is obtained by removing a part of the pixel defining layer as well. The depth of a channel may be equal to the depth of an opening. And, the depth of a channel may also be smaller than depth of an opening, but in order to guarantee flow of an organic light emitting material within the intercommunicated sub-pixel defining zones, a difference between depth of the opening and depth of the channel is preferably smaller than thickness of an organic luminous layer to be formed within the sub-pixel defining zones.

Figure 4:
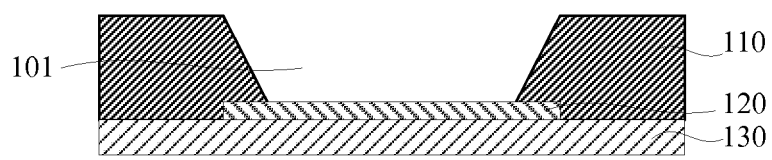
FIG. 4 is a schematic view illustrating an OLED pixel defining structure in which a sub-pixel defining zone partially overlaps a corresponding pixel electrode in an embodiment of the invention.
Figure 5:
FIG. 5 is a schematic view illustrating an OLED pixel defining structure in which a sub-pixel defining zone fully overlaps a corresponding pixel electrode in an embodiment of the invention.

The pixel defining structure further comprises pixel electrodes 120 below the sub-pixel defining zones 101; the pixel electrodes 120 correspond to the sub-pixel defining zones 101 on a one-to-one basis, and a sub-pixel defining zone 101 partially or fully overlaps a corresponding pixel electrode 120. As illustrated in FIG. 4, which is a case where a sub-pixel defining zone 101 partially overlaps a corresponding pixel electrode 120, the pixel defining structure comprises a pixel defining layer 110, pixel electrodes 120 and a TFT substrate 130, wherein sub-pixel defining zones 101 are included in the pixel defining layer 110; the pixel electrodes 120 are located over the TFT substrate 130, the sub-pixel defining zones 101 are located over the pixel electrodes 120, the sub-pixel defining zones 101 partially overlap the pixel electrodes 120; on a region where the TFT substrate 130 is not covered by the pixel electrodes 120 and on a region where the pixel electrodes 120 are not covered by the sub-pixel defining zones 101 is the pixel defining layer 110. As illustrated in FIG. 5, which is a case where a sub-pixel defining zone 101 fully overlaps a corresponding pixel electrode 120, the pixel defining structure comprises a pixel defining layer 110, pixel electrodes 120 and a TFT substrate 130, wherein sub-pixel defining zones 101 are included in the pixel defining layer 110; the pixel electrodes 120 are located over the TFT substrate 130, the sub-pixel defining zones 101 are located over the TFT substrate 130, the sub-pixel defining zones 101 fully overlap the pixel electrodes 120; on a region where the TFT substrate 130 is not covered by the pixel electrodes 120 is the pixel defining layer 110.

In an existing inkjet printing technology, owing to the restriction of size of inkjet droplets and the limitation in printing accuracy of a printer per se, it is very difficult to fabricate a display device with high resolution and high quality. In embodiments of the invention, there is no pixel defining layer between two adjacent sub-pixel defining zones 101 of the same color that intercommunicate with each other, and when a sub-pixel defining zone set is formed, an adverse effect brought by the printing accuracy error of an inkjet printing equipment can be decreased, thereby improving the quality of light emission of the display back panel. In one sub-pixel defining zone set, the emission area of the sub-pixel defining zone set is controlled by the area of a pixel electrode. When one pixel electrode is in a switched-on state, a corresponding region in a sub-pixel defining zone set corresponding to the pixel electrode is lit up; and other region of the sub-pixel defining zone set will not give off light if a corresponding pixel electrode is not switched on.

Figure 6:
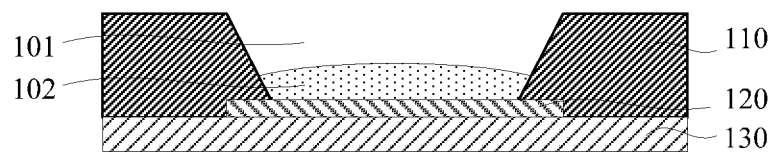
FIG. 6 is a schematic view illustrating a sub-pixel light emitting layer of a sub-pixel defining zone in an embodiment of the invention.

As illustrated in FIG. 6, a sub-pixel light emitting layer 102 formed of an organic light emitting material is contained in a sub-pixel defining zone 101. As at least two sub-pixel defining zones of the same color are intercommunicated, it is easier to form a sub-pixel light emitting layer with a uniform thickness. Moreover, sub-pixel luminous layers 102 of different colors may differ in thickness.

Figure 7:
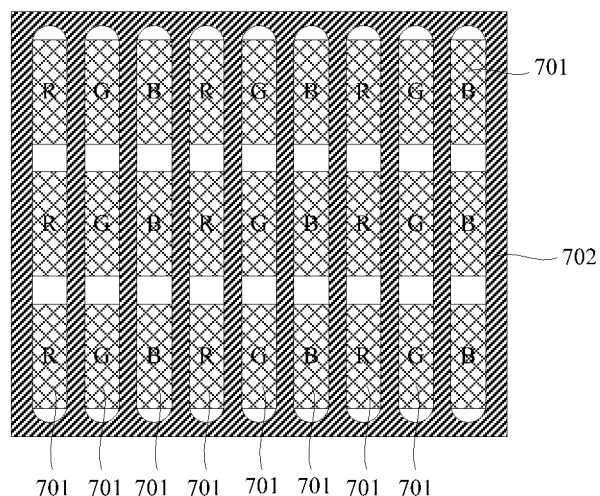
FIG. 7 is a schematic view illustrating display of an OLED pixel defining structure in an embodiment of the invention.

Preferably, a second electrode is formed on the sub-pixel light emitting layer. FIG. 7 is a schematic view illustrating display of a pixel defining structure after a pixel defining layer between two adjacent sub-pixel defining zones of the same color that intercommunicate with each other is removed in an embodiment of the invention, wherein, "701" denotes a sub-pixel light emitting layer covered by a second electrode, and "702" denotes a substrate.

In embodiments of the invention, description has been given to an example in which in the OLED pixel defining structure, sub-pixel defining zones in one column are sub-pixel defining zones of the same color. Other case, such as the case where sub-pixel defining zones in one row are sub-pixel defining zones of the same color, or the case where adjacent sub-pixel defining zones are sub-pixel defining zones of the same color, is in an analogous fashion to it, and details are omitted here.

Further, according to an embodiment of the invention, there is further provided an OLED array substrate. The array substrate comprises a substrate, the pixel defining structure according to any of the above embodiments that is formed on the substrate, and sub-pixel light emitting layers formed within sub-pixel defining zones.

Based on the same inventive concept, there is further provided a manufacturing method of an OLED pixel defining structure according to an embodiment of the invention. As the principle to solve problems of the manufacturing method is similar to that of an OLED pixel defining structure according to an embodiment of the invention, implementation of the method may refer to implementation of the device, and repetitions are omitted here.

According to an embodiment of the invention, there is provided a manufacturing method of an OLED pixel defining structure, comprising:

Step 801: a layer of photoresist is coated on a pixel electrode, so as to form a photoresist thin film for pixel definition;

Step 802: a patterning treatment is conducted on the photoresist thin film for pixel definition, so as to form a pixel defining layer; wherein at least two sub-pixel defining zones of the same color in the pixel defining layer are intercommunicated.

Before a layer of photoresist is coated on the pixel electrode in step 801, it further comprises forming the pixel electrode on a substrate.

Figure 8:
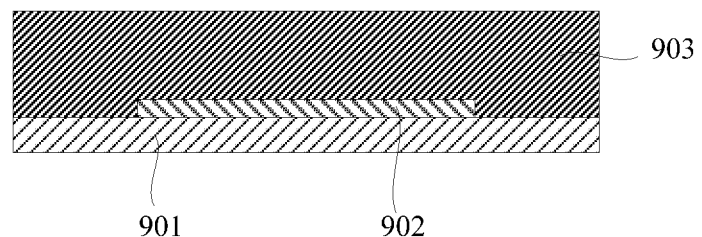
FIG. 8 is a schematically sectional view illustrating a photoresist thin film for pixel definition that is coated on a substrate in an embodiment of the invention.

The step 801 concretely comprises: a polymer photoresist solution is spin-coated or scratch-coated on a substrate containing a pixel electrode, and solvent in the solution is removed under a condition of low temperature, so as to form the photoresist thin film for pixel definition. As illustrated in FIG. 8, "901" denotes a substrate, "902" denotes a pixel electrode, and "903" denotes a photoresist thin film for pixel definition.

Conducting the patterning treatment on the photoresist thin film for pixel definition in step 802 comprises: the photoresist thin film for pixel definition is subjected to exposure and development to form pixel defining zones, wherein, at least two sub-pixel defining zones of the same color are intercommunicated.

As illustrated in FIG. 2 and FIG. 3, intercommunication of at least two sub-pixel defining zones of the same color comprises two cases:

Case 1, one sub-pixel defining zone is intercommunicated with a sub-pixel defining zone 101 of the same color as it through a channel, and width of the channel between sub-pixel defining zones is smaller than width of the sub-pixel defining zones. One sub-pixel defining zone is intercommunicated with adjacent sub-pixel defining zones of the same color as it through channels, and each sub-pixel defining zone is intercommunicated at most with two adjacent sub-pixel defining zones of the same color as it through channels. Alternatively, sub-pixel defining zones of the same color intercommunicate with each other through channels, that is, one sub-pixel defining zone is intercommunicated at least with two sub-pixel defining zones of the same color as it; and sub-pixel defining zones of the same color in different columns may also intercommunicate through a channel.

Case 2, a channel between two adjacent sub-pixel defining zones of the same color that are intercommunicated with each other has a width equal to that of the sub-pixel defining zones. Sub-pixel defining zones in the same column of the same color form one sub-pixel defining zone set; or sub-pixel defining zones in the same column of the same color form two or more sub-pixel defining zone sets. Sub-pixel defining zone sets of the same color in different columns may be intercommunicated through a channel.

In step 802, a pixel defining layer is formed after patterning treatment is conducted on the photoresist thin film, and is subjected to a high-temperature annealing treatment, wherein sub-pixel defining zones of different colors are contained in the pixel defining layer.

The step 802 further comprises: a solution of an organic light emitting material having diverse colors drops into a corresponding sub-pixel defining zone, as the intercommunicated sub-pixel defining zones are more helpful for the flow of liquid, film-forming thickness for the solution of the organic light emitting material of the same color easily tends to be uniform too; and solvent in the solution of the organic light emitting material is removed, so as to form the sub-pixel light emitting layer with a uniform thickness illustrated in FIG. 5, wherein sub-pixel light emitting layers of different colors may differ in thickness. As long as the solution of the organic light emitting material drops within intercommunicated sub-pixel defining zones, a sub-pixel light emitting layer with a uniform thickness can be formed with the aid of the flowability of liquid. Thus, requirement on the accuracy of equipment is downgraded, and the cost of equipment is also reduced.

In an embodiment of the invention, there is provided a concrete manufacturing method of an OLED pixel defining structure, comprising:

Step 1001: a desired number of pixel electrodes are formed on a substrate;

Step 1002: a photoresist solution is spin-coated on the pixel electrode and the substrate not covered by the pixel electrode;

Step 1003: solvent in the photoresist solution is removed under a condition of low temperature, so as to form a photoresist thin film for pixel definition;

Step 1004: a patterning treatment is conducted on the photoresist thin film for pixel definition, so that at least two sub-pixel defining zones of the same color corresponding to the photoresist thin film for pixel definition are intercommunicated;

Step 1005: a pixel defining layer that contains sub-pixel defining zones of different colors is formed;

Step 1006: a solution of an organic light emitting material drops into the sub-pixel defining zones;

Step 1007: solvent in the solution of the organic light emitting material is removed, so as to form a subpixel-defining-zone light emitting layer;

Step 1008: a second electrode is deposited on the sub-pixel-defining zone light emitting layer through evaporation, printing.

Descriptions made above are merely exemplary embodiments of the invention, but are not used to limit the protection scope of the invention. The protection scope of the invention is determined by attached claims.

What is claimed is:

1. An OLED pixel defining structure, comprising a pixel defining layer containing a plurality of openings, the plurality of openings forming a plurality of sub-pixel defining zones of different colors, wherein
    the plurality of sub-pixel defining zones are arranged into columns and rows, each of the columns extends in a first direction, and each of the rows extends in a second direction that is different from the first direction;
    the sub-pixel defining zones in each of the columns have only one color, and the sub-pixel defining zones in each of the rows have different colors; and
    at least two sub-pixel defining zones having a same color and provided in different columns intercommunicate with each other through a groove recessed in the pixel defining layer and guiding a liquid to flow only between the at least two sub-pixel defining zones.

2. The pixel defining structure of claim 1, wherein the groove has a width smaller than or equal to widths of the plurality of sub-pixel defining zones.

3. The pixel defining structure according to claim 2, wherein the groove has a depth equal to or smaller than depths of the plurality of openings.

4. The pixel defining structure according to claim 1, wherein at least two sub-pixel defining zones having a same color and provided in a same column and different rows intercommunicate through another groove recessed in the pixel defining layer.

5. The pixel defining structure according to claim 1, wherein the groove has a depth equal to or smaller than depths of the plurality of openings.

6. The pixel defining structure according to claim 1, wherein the groove is continuous, one end of the groove is directly connected with one of the at least two sub-pixel defining zones, and the other end of the groove is directly connected with the other of the at least two sub-pixel defining zones.

7. An OLED array substrate, comprising:
    a substrate;
    a pixel defining structure formed on the substrate, which comprises a pixel defining layer containing a plurality of openings, the plurality of openings forming a plurality of sub-pixel defining zones of different colors; and
    sub-pixel light emitting layers formed within the sub-pixel defining zones, each sub-pixel light emitting layer being formed of an organic light emitting material of a corresponding color, wherein
    the plurality of sub-pixel defining zones are arranged into columns and rows, each of the columns extends in a first direction, and each of the rows extends in a second direction that is different from the first direction;
    the sub-pixel defining zones in each of the columns have only one color, and the sub-pixel defining zones in each of the rows have different colors; and
    at least two sub-pixel defining zones having a same color and provided in different columns intercommunicate with each other through a groove recessed in the pixel defining layer and guiding a liquid to flow only between the at least two sub-pixel defining zones.

8. The array substrate of claim 7, wherein the groove has a width smaller than or equal to widths of the plurality of sub-pixel defining zones.

9. The array substrate of claim 8, wherein the groove has a depth equal to or smaller than depths of the plurality of openings, and a difference between the depth of the groove and the depths of the plurality of openings is smaller than thicknesses of the light emitting layers formed in the plurality of sub-pixel defining zones.

10. The array substrate of claim 8, wherein the sub-pixel light emitting layers in the plurality of sub-pixel defining zones of different colors differ in thickness.

11. The array substrate of claim 7, wherein the groove has a depth equal to or smaller than depths of the plurality of openings, and a difference between the depth of the groove and the depths of the plurality of openings is smaller than thicknesses of the light emitting layers formed in the plurality of sub-pixel defining zones.

12. The array substrate of claim 7, wherein the sub-pixel light emitting layers in the plurality of sub-pixel defining zones of different colors differ in thickness.

13. The array substrate according to claim 7, wherein at least two sub-pixel defining zones having a same color and provided in a same column and different rows intercommunicate through another groove recessed in the pixel defining layer.

14. The array substrate according to claim 7, wherein the groove is continuous, one end of the groove is directly connected with one of the at least two sub-pixel defining zones, and the other end of the groove is directly connected with the other of the at least two sub-pixel defining zones.

15. A manufacturing method of an OLED pixel defining structure, comprising:
    applying a layer of photoresist on a pixel electrode, so as to form a photoresist thin film for pixel definition;
    conducting a patterning treatment on the photoresist thin film for pixel definition, so as to form a pixel defining layer; wherein the pixel defining layer contains a plurality of openings, the plurality of openings form a plurality of sub-pixel defining zones of different colors, the plurality of sub-pixel defining zones are arranged into columns and rows, each of the columns extends in a first direction, and each of the rows extends in a second direction that is different from the first direction;

the sub-pixel defining zones in each of the columns have only one color, and the sub-pixel defining zones in each of the rows have different colors; and at least two sub-pixel defining zones having a same color and provided in different columns intercommunicate with each other through a groove recessed in the pixel defining layer and guiding a liquid to flow only between the at least two sub-pixel defining zones.

16. The method of claim 15, wherein the pixel defining layer between the sub-pixel defining zones of the same color that intercommunicate with each other is partially or fully removed, so that the groove between the sub-pixel defining zones has a width smaller than or equal to widths of the sub-pixel defining zones.

* * * * *